United States Patent [19]

Green, Jr.

[11] Patent Number: 5,266,506
[45] Date of Patent: Nov. 30, 1993

[54] METHOD OF MAKING SUBSTANTIALLY LINEAR FIELD-EFFECT TRANSISTOR

[75] Inventor: Donald R. Green, Jr., Wyomissing, Pa.

[73] Assignee: AT&T Bell Laboratories, Murray Hill, N.J.

[21] Appl. No.: 852,369

[22] Filed: Mar. 13, 1992

Related U.S. Application Data

[62] Division of Ser. No. 560,683, Jul. 31, 1990, abandoned.

[51] Int. Cl.⁵ .......................................... H01L 21/265
[52] U.S. Cl. ..................... 437/41; 257/192; 148/DIG. 53
[58] Field of Search ................. 437/41; 257/192, 194; 148/DIG. 53

[56] References Cited

U.S. PATENT DOCUMENTS

| | | | |
|---|---|---|---|
| 4,163,237 | 7/1979 | Dingle et al. | 357/16 |
| 4,424,525 | 1/1984 | Mimura | 357/16 |
| 4,641,161 | 2/1987 | Kim et al. | 357/16 |
| 4,821,093 | 4/1989 | Iafrate et al. | 357/16 |

FOREIGN PATENT DOCUMENTS

| | | | |
|---|---|---|---|
| 60-235476 | 11/1985 | Japan | 357/16 |
| 62-219967 | 9/1987 | Japan | 357/16 |
| 63-161678 | 7/1988 | Japan | 357/16 |
| 01-050570 | 2/1989 | Japan | 357/16 |

OTHER PUBLICATIONS

Okada et al., "Quasi-one-dimentional Channel GaAs-/AlGaAs Modulation Doped FET Using Corrugated Gate Structure", Extended Abstracts of the 20th Conf. on Solid State Dev. & Mat. Tokyo (1988) pp. 503–506.
"Modeling for Electron Transport in AlGaAs/GaAs-/AlGaAs Double-Heterojunction Structures", IEEE Transactions on Electron Devices, vol. 36, No. 11, Nov. 1989, Masaaki Tomizawa, Tomofumi Furuta, Kiyoyuki Yokayama, Akira Yoshii, pp. 2380–2385.
Drummond et al., "p-channel, strained quantum well, field effect transistor," Appl. Phys. Lett, 49(8), Aug. 25. 1986, pp. 461–463.
Hokosaka et al. "A 30-GHz 1-W Power HEMT," IEEE Electron Dev. Lett., vol. EDL-8, No. 11, Nov. 1987, pp. 521–523.
Houssaye et al., "Electron Saturation Velocity Variation in InGaAs and GaAs Channel MODFETs for Gate Lengths to 550Å," IEEE Electron Dev. Lett., vol. 9, No. 3, Mar. 1988, pp. 148–150.
Akinwande et al., "A Self-Align ... MODFET," IEEE Elec. Dev. lett., vol. 9, No. 6, Jun. 1988, pp. 275–277.
Vinter, "Tunneling transfer field-effect transistor: A negative transconductance device," Appl. Phys. Lett. 50(7), Feb. 16, 1987, pp. 410–412.
Sawnier et al., "High Efficiency Millimeter-Wave GaAs/GaAlAs Power HEMT's, " IEEE Electron Dev. Lett., vol. Edl-7, No. 9, Sep. 1986, pp. 503–505.
Henderson et al., "Determination of Carrier Saturation Velocity in High-Performance InGaAs/AlGaAs Modulation-Doped Field Effect Transistors," IEEE Elec. Dev. Lett., vol. EDL-7, No. 5, May 1986.

*Primary Examiner*—Olik Chaudhuri
*Assistant Examiner*—Long Pham
*Attorney, Agent, or Firm*—Scott W. McLellan

[57] ABSTRACT

An FET with multiple channels to provide a substantially linear transfer characteristic. The widths and carrier concentrations of the channels, and the depths of the channels below the gate of the FET, are adjusted such that a substantially linear gate voltage-to-output current (drain) transfer characteristic of the FET results. In addition, the electrical characteristics of the FET may be adjusted by changing the spacing of the drain and source diffusions from the gate.

9 Claims, 6 Drawing Sheets

METHOD OF MAKING SUBSTANTIALLY LINEAR FIELD-EFFECT TRANSISTOR

This is a division of application Ser. No. 07/560683 filed Jul. 31, 1990, now abandoned.

BACKGROUND OF THE INVENTION

1. Field of the Invention

This invention relates to field-effect transistors in general and, more particularly, to multiple quantum well heterojunction field-effect transistors.

2. Description of the Prior Art

Large signal amplifiers, such as power amplifiers, require careful design to minimize nonlinear distortions, such as harmonic or intermodulation distortions, of the signals being amplified. For example, in power amplifier designs used for radio frequency transmitters, low-pass filter networks are provided at the output of the power amplifier to reduce the harmonic content of the output signal below Federal Communication Commission mandated harmonic and spurious signal levels (typically expressed in decibels below the output signal power level). The higher the harmonic content of the output signal from the power amplifier, the more complex the filter arrangement and the less efficient the power amplifier becomes. Also, many signal modulation formats used for communication systems are intolerant to high levels of in-band intermodulation distortion caused by amplifier nonlinearities which cannot be removed with filters. As a result, the power amplifier operates at a output power level significantly below the maximum output power level of which it is otherwise capable of in order to reduce intermodulation distortion to acceptable levels. Such intermodulation distortion requirements can necessitate the use of a larger, costlier, amplifier than would be required solely on the basic output power level considerations. To reduce the harmonic distortion, the power amplifier may be designed as a class A, B, AB$_1$, or AB$_2$ amplifier which, through circuit techniques and biasing arrangements, reduce the harmonic distortion to less than is possible from a class C, D, or S amplifier. However, the output signal harmonic and intermodulation distortion content of a class A, B, AB$_1$, or AB$_2$ amplifier may still be higher than that desired. A major cause of harmonic and intermodulation distortion in these classes of amplifiers is the nonlinear transfer characteristics of the active device or devices used in the amplifier.

Another application where low amplifier distortion is especially desirable is in a receiver preamplifier. The performance of a receiver may be significantly degraded if the first stage amplifier thereof distorts strong signals entering the receiver. The dominant effect of distorting the entering signals, particularly those signals having a frequency near the frequency of the desired signal and having a much larger amplitude, is the cross-modulation or intermodulation of the desired signal by the "unwanted" signal(s). The cross-modulation can distort the desired signal to the point of making it unusable. Thus, the preamplifier is usually a class A amplifier, typically the most distortion-free of all amplifier classes. However, as mentioned above, the minimum possible distortion level is set by the non-linearity of the active device(s) in the first stage amplifier.

Substantially all conventional active devices, such as bipolar transistors or field-effect transistors, have nonlinear transfer characteristics, i.e., the AC gain (transconductance) of the device changes with the amplitude of the input signal. For example, the transfer characteristic of a field-effect transistor (FET) follows a "power" law (usually either square or 3/2 power) instead of a "linear" law (a "linear law" being indicative of constant transconductance over a large range of input power levels). A "power" law transfer characteristic, under large signal conditions, causes nonlinear distortions in the amplified signal.

Another advantage of "linear" law (nearly constant transconductance) over "power" law transfer characteristics is the obtaining of higher dc to rf and power-added efficiencies in high-efficiency power amplifier circuits which are typically designed to work in Classes other than Class A (e.g., Class B or Class C). A "linear" law (constant or nearly constant transconductance) device exhibits less power gain degradation and higher efficiencies than "power" law devices because of the "linear" nature of its transfer characteristics.

SUMMARY OF THE INVENTION

It is therefore one aspect of this invention to provide a field-effect transistor having a substantially linear transfer characteristic useful in low distortion and high efficiency amplifiers or the like.

This and other aspects of the invention may be generally provided for by a field-effect transistor structure, formed in a substrate and having source and drain contacts on the major surface of the substrate and a gate disposed between the source and drain contacts. This structure is characterized by having a plurality of conductive channels, selectively having charge carriers therein, in contact with conductive regions in the substrate corresponding to, and in contact with, the source and drain contacts, the regions extending through the plurality of channel layers. The depth of the channels below the major surface of the substrate, the thickness and the charge carrier concentrations of the channels are adjusted such that the gate input voltage-to-output drain current transfer characteristic of the transistor is substantially linear over a predetermined range of input voltages applied to the gate.

The invention may also be generally provided for by a method of making a field-effect transistor, characterized by the steps of: forming on a substrate a plurality of alternating donor and channel support layers, the donor layer material being a wider bandgap than the material of the channel support layer and having donor impurity dopants therein for providing carriers to conductive channels created in the channel support layers; forming a gate; implanting into the donor and conduction layers, masked by the gate, to form self-aligned source and drain regions; and, contacting the so formed source and drain regions. The channels are formed by the heterojunctions between the channel support layers and the donor layers. The depth of the channels below the major surface of the substrate, the thickness of the channels, and the charge carrier concentrations therein are adjusted such that the gate input voltage-to-output drain current transfer characteristic of the transistor is substantially linear over a predetermined range of input voltages applied to the gate.

It has also been discovered that by forming a lightly-doped region between the gate and drain and/or source diffusion in a field-effect transistor, the threshold voltage thereof may varied in accordance with the width of the lightly-doped region.

BRIEF DESCRIPTION OF THE DRAWING

The foregoing features of this invention, as well as the invention itself, may be more fully understood from the following detailed description of the drawings, in which.

DETAILED DESCRIPTION

The device and the method of making the same discussed in this application has substantial commonality with the devices, and method of making those devices, as discussed in U.S. Pat. No. 5,041,393 by Ahrens et al., and assigned to the same assignee as this invention. The Ahrens et al. application is included herein by reference.

Although the compound semiconductor material referred to here is based on gallium arsenide (GaAs) and aluminum gallium arsenide (AlGaAs), other compound semiconductor material systems could be substituted, such as indium aluminum arsenide (InAlAs)/indium gallium arsenide (InGaAs) or silicon/germanium. The concentration (i.e., mole fraction) of aluminum in the AlGaAs is usually identified as the percentage of aluminum in AlGaAs displacing the gallium therein, where the mole fraction can range from 0 percent (GaAs) to 100 percent (AlAs). Generally, the more the aluminum, the higher (wider) the bandgap energy of the AlGaAs material, i.e., AlGaAs is wider bandgap material than GaAs material.

Figure 1:
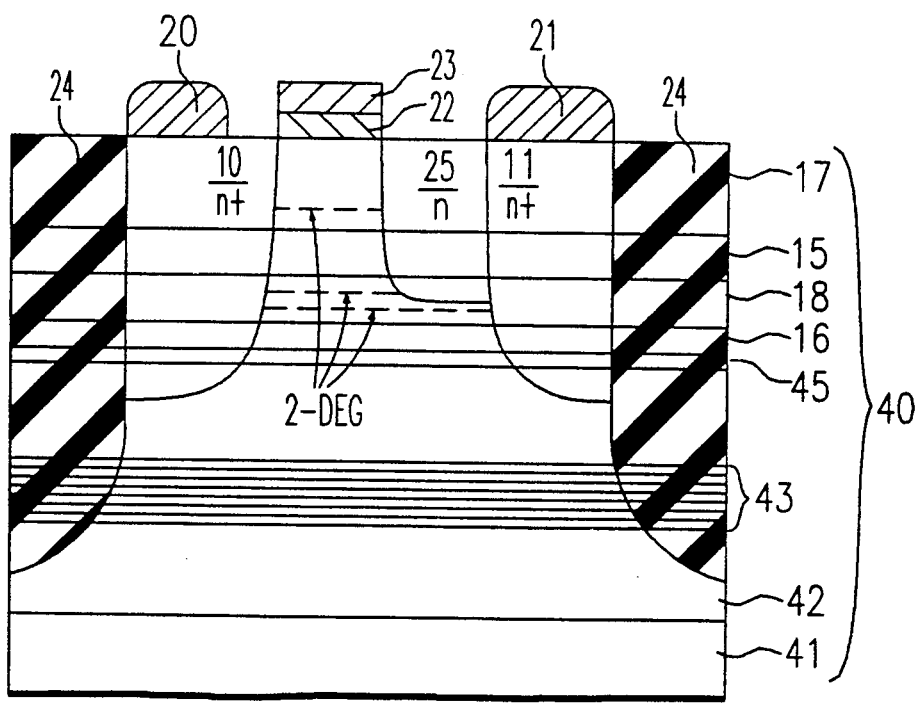
FIG. 1 is an exemplary field-effect transistor structure (not to scale) according to one aspect of the invention.

The device structure shown in FIG. 1 is an exemplary embodiment, according to one aspect of the invention, of a self-aligned field-effect transistor (FET) 1 having a substantially linear input voltage-to-output current transfer characteristic over a predetermined range of input voltages. This device is especially useful in providing large power gain at microwave frequencies, such as above 10 GHz. To allow for such a transfer characteristic, the FET 1 is configured have a plurality of channels to confine and support charge carriers therein (here a two-dimensional electron gas or 2-DEG). The channels are the active regions in the FET 1 and contact the source and drain diffusions 10, 11. The channels (2-DEG) are formed by the heterojunctions of wide-bandgap donor layers 15, 16 and narrow band-gap channel support layers 17, 18, as will be explained in more detail below. The thicknesses of the layers 15–18, the doping in layer 15, 16 and the depths of channels below the gate 22,23 of FET 1, as will be explained in more detail below, adjusted to give the desired linear transfer characteristics.

The structure of FET 1 is discussed in detail herein. The steps for forming the FET 1 and the wafer 40, into which the FET 1 is formed, will be discussed in detail below. FET 1 has source and drain contacts 20,21 attached to the major surface of the FET 1 structure, here the top of layer 17. The contacts are of metal (typically a gold:germanium/nickel/gold alloy) and are in ohmic contact with source and drain diffusions 10, 11. Similarly, a gate of silicide 22 and contact metal 23 is also attached to the major surface of the FET 1 except that it is in rectifying (Schottky barrier) contact with the layer 17. Isolation regions 24 electrically isolate adjoining FETs or other devices (not shown) formed in the wafer (40). A lightly doped region 25, juxtapositioned and in contact with the drain diffusion 11 but having a higher resistivity than diffusion 11, provides for a higher drain-to-source breakdown voltage than would otherwise be possible if the drain diffusion 11 was aligned with the gate 22,23 as shown for the source diffusion 10. It is noted, as will be discussed in detail below, that the width of the region 25, measured by the distance between the edge of the gate 22,23 and the drain diffusion 11, can be varied to adjust the transconductance and threshold voltage of the FET 1. Further, another lightly doped region (not shown), corresponding to region 25, may be placed between the source diffusion 10 and the gate 22, 23 to further modify the breakdown voltage, transconductance and threshold voltage of the FET 1. Still further, the region 25 may be eliminated if a lower operating voltages (drain-to-source voltage) is used such as, for example, in logic circuits.

Figure 2:
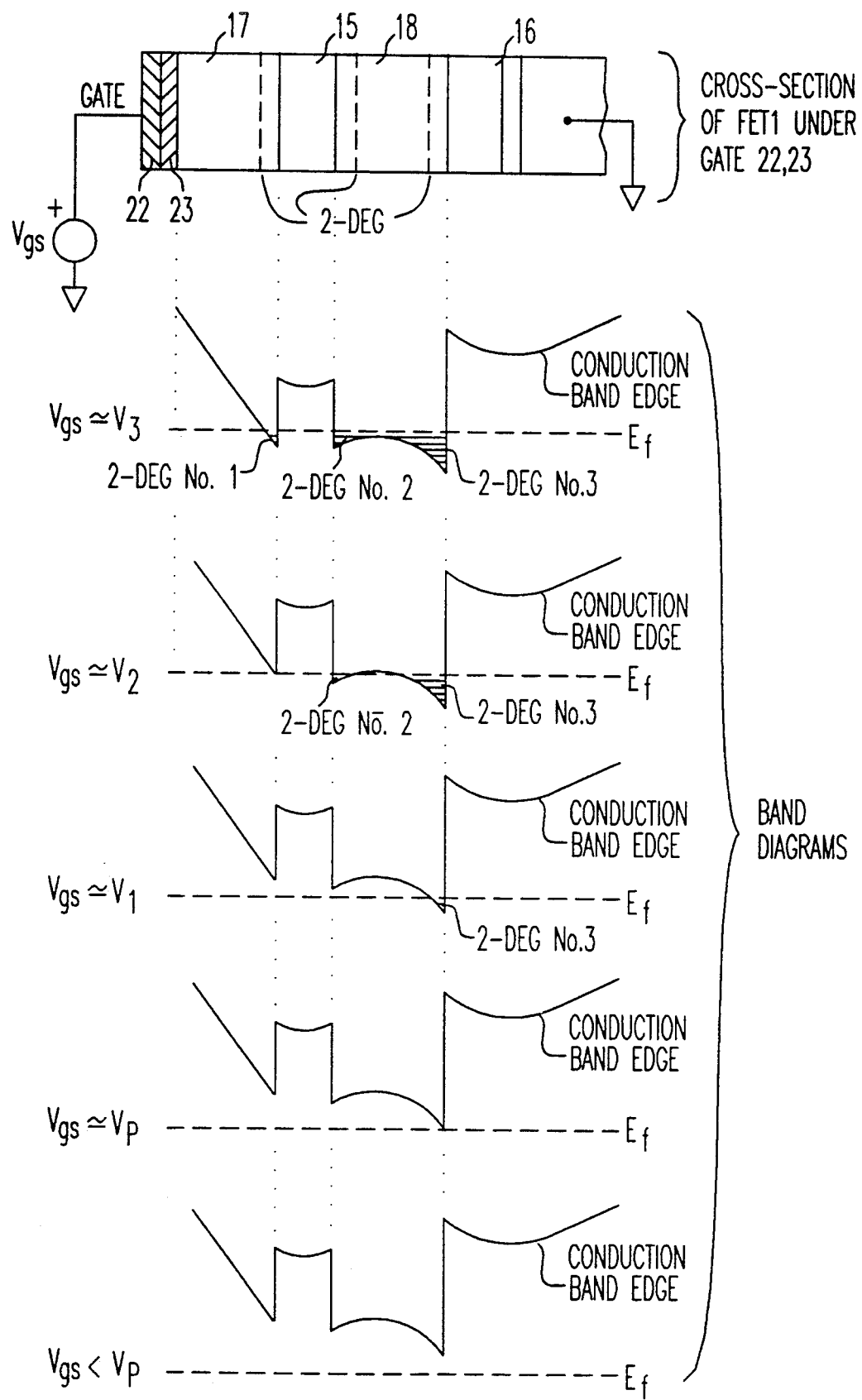
FIG. 2 is a simplified cross-sectional diagram of the exemplary transistor structure of FIG. 1 with exemplary energy band diagrams (not to scale) showing the distribution of carriers therein for various values of $V_{gs}$.

As stated above, the channel support layers 17, 18 support the plurality of channels (2-DEG) therein by the existence of corresponding quantum wells. The quantum wells are formed as a result of the heterojunctions between the layers 17, 18 and the donor layers 15, 16 and band-bending within the layers 17, 18. This is diagramed in FIG. 2. A simplified cross-sectional diagram of the FET 1 (FIG. 1) structure is shown having the gate 22, 23 thereon to adjust the applied voltage, i.e., the equivalent gate-to-source voltage $V_{gs}$. Corresponding to the diagramed structure, a first quantum mechanical conduction band energy diagram is shown under a bias voltage of $V_3$ with the Fermi energy level being signified by the dashed line $E_F$. In the channel supporting layer 17, the heterojunction between layers 17 and 15 form one edge of a quantum well while band-bending forms the other edge of the well, thereby trapping charge the (2-DEG) for a first channel, here 2-DEG No. 1. Similarly, in larger 18 two quantum wells are formed by the heterojunctions between the layer 18 and donor layers 15 and 16 and band-bending within the layer 18 to form channels 2-DEG No. 2 and No. 3.

Although beyond the scope of the discussion here, the distance the bottom edge of the conduction band of the channel support layers 17, 18 is from the Fermi energy level ($E_F$) determines the charge density in the channels (2-DEG) therein. The closer the bottom of the conduction band is to the Fermi energy level ($E_F$), the less charge can exist in a channel since fewer Eigen states can exist in the quantum well supporting the channel. Once the conduction band exceeds $E_F$, the channel is "pinched off", and no substantial current flows in the channel. This is illustrated in the second quantum mechanical conduction band diagram in FIG. 2. If the bias voltage ($V_{gs}$) is reduced to the voltage $V_2$, the "channel" in the layer 17 is above the Fermi energy level and can no longer support charge therein. Thus, essentially no current passes in the channel and it is "pinched off" as will be illustrated in connection with FIGS. 3a–3c. The reduced bias voltage also affects the channels in layer 18 by reducing the capability of the channel in layer 18 nearest layer 15 (2-DEG No. 2) to carry charge. The net result is a reduction in the charge density in layer 18, reducing the current flow between the source 20 and drain 21 terminals (FET 1, FIG. 1) as the gate-to-source voltage ($V_{gs}$) is reduced. As the gate voltage $V_{gs}$ is further reduced to voltage $V_1$, the channel 2-DEG No. 2 is "pinched off", leaving only channel 2-DEG No. 3 to carry current. Finally, once $V_{gs}=V_p$, the pinch-off voltage of the FET 1, no channel conducts current and the FET 1 is "off". Decreasing $V_{gs}$ below $V_p$ does not affect the current passing therein.

Figure 3A:
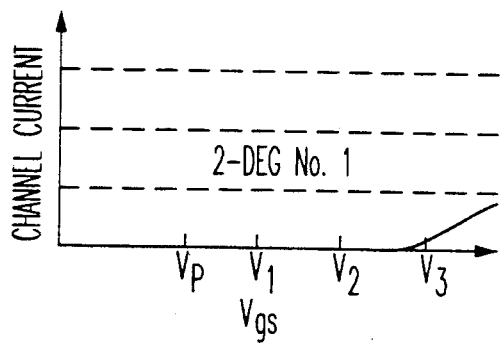
FIG. 3a–3d are graphs (not to scale) of the exemplary gate voltage-to-channel current transfer characteristics of the exemplary transistor structure of FIG. 1 showing the current contributions of the constituent conducting channels therein.
Figure 3B:
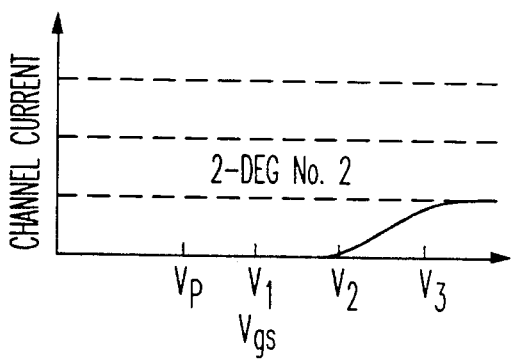
Figure 3C:
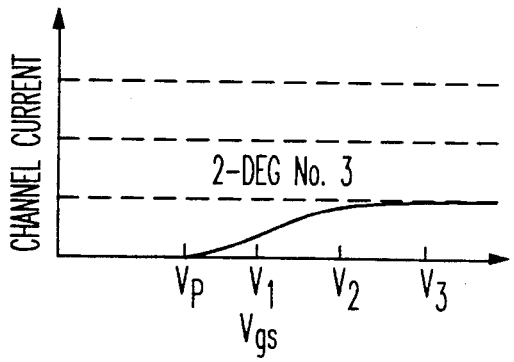
Figure 3D:
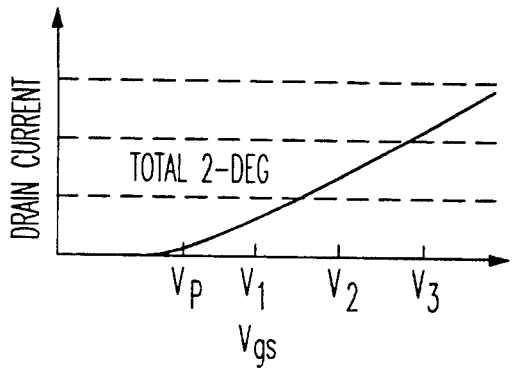

An exemplary linear transfer characteristic for the FET 1 of FIG. 1 is shown diagrammatically in FIGS. 3a–3d, illustrating the advantage accrued by having multiple channels in the FET 1. In FIGS. 3a–3c, the exemplary drain current contribution of each of the channels (2-DEG No. 1–3, FIG. 2) are shown, corresponding to the band diagrams and gate voltages ($V_{gs}$) in FIG. 2. As shown, as the gate voltage $V_{gs}$ is decreased from $V_3$ to $V_p$ the current in each channel (2-DEG No. 1–3) decreases accordingly. Note the correspondence between the $V_{gs}$ voltage at which substantially all channel current stops ($V_p$) and the "pinching off" of all the channels (2-DEG Nos. 1–3) in FIG. 2. Although beyond the scope of this discussion, it is also noted that above a certain $V_{gs}$ the current in each channel does not increase since the maximum number of carriers in each channel (as determined by the doping level of the donor layers 15, 16, FIG. 1) is fixed. For example, the channel current in channel No. 3 does not substantially increase when the $V_{gs}$ is above $V_3$. Hence, when the channel currents are summed to yield the FET 1 (FIG. 1) drain current, the gate-to-source voltage vs. drain current transfer characteristic is substantially linear over a predetermined range of gate voltages, here from about $V_p$ to beyond $V_3$.

Figure 3E:
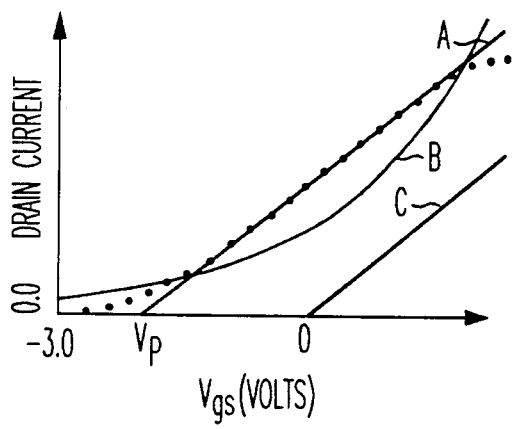
FIG. 3e is a graph (not to scale) of the exemplary gate voltage-to-drain current transfer characteristic of the exemplary transistor structure of FIG. 1 with and without a lightly doped drain structure and a typical transfer characteristic of prior-art field-effect transistors; and, FIGS. 4–10 diagrams an exemplary process for the formation of the field-effect transistor according to one aspect of the invention, the result being the device of FIG. 1.

To illustrate the above, representative data points from actual measurements of the transfer characteristic of an exemplary FET 1 (FIG. 1) fabricated with exemplary doping densities, layer thickness, etc. to be given below are shown in FIG. 3e. The points show a substantially linear transfer characteristic between the input voltage to the FET 1 (FIG. 1), as applied between the gate 22, 23 and source 20 contacts, and the drain current thereof. A straight line A is shown tangential to points demonstrating the relative linearity of the transfer characteristic over a predetermined portion of the input voltage range. Plot B demonstrates the transfer characteristic of an exemplary "conventional" single channel FET (such as a high electron mobility transistor or HEMT). Note that the plot B does not have any substantially linear portion, which is demonstrative of the "square law" characteristic of "conventional" FETs.

As discussed above, the distance the gate 22,23 is from the drain diffusion region 11 has an affect on the transfer characteristics of the FET 1 (FIG. 1). In FIG. 3, plot C shows the effect of eliminating the LDD region 25 from the FET 1 structure of FIG. 1 and extending the drain region 11 to include the volume formerly occupied by the region 25; i.e., the region 25 is doped to the level of the dopant in region 11 (n+) such that it is substantially indistinguishable from region 11 This has the effect of making the distance from the gate to drain diffusion region 11 near zero. As shown, the characteristics of the FET 1 is now substantially different from that demonstrated in plot A. The threshold voltage (the gate-to-source voltage at which the FET 1 has a small, predetermined, amount of current flowing in the drain, signified by the tangential line to the transfer characteristic plot intersecting the zero drain current axis) has been increased positively, making the FET 1 more of an "enhancement" device that the FET 1 of plot A, a "depletion" device. In addition, the transconductance of the device (the slope of the plots) is somewhat greater in plot C than in plot A. Hence, the gate-to-drain diffusion distance may also be adjusted to control the transconductance of the FET 1.

An exemplary fabrication process for the FET 1 structure of FIG. 1 is shown in FIGS. 4 through 10. The significant steps necessary for the device fabrication will be explained; it is understood that certain steps that are well known in the industry (e.g., spinning on photoresist, wafer cleaning, etc.) are necessary for a complete fabrication recipe. Although GaAs and AlGaAs are referenced here as the types of materials used, other narrow bandgap/wide bandgap materials may be substituted, such as InP/InGaAs or Si/Ge systems and other II–VI and III–V combinations.

Figure 4:
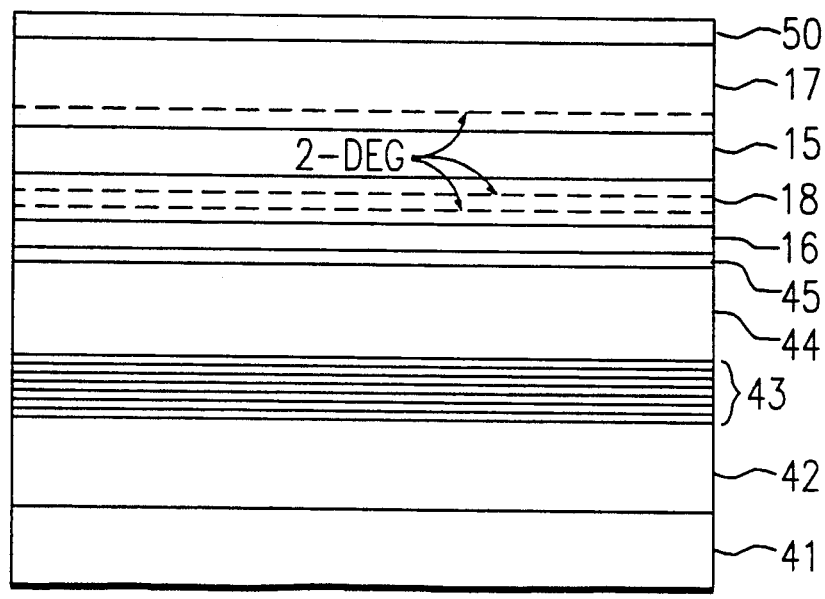

In FIG. 4, a wafer 40 is shown having a GaAs substrate 41, a GaAs buffer 42, and a series of alternating GaAs/AlGaAs layers forming a superlattice 43. Next, an AlGaAs buffer layer 44 is grown or deposited onto the superlattice 43. Next, a GaAs diffusion barrier 45 is deposited on the AlGaAs buffer layer 44. Layer 45 serves to keep dopant species from the AlGaAs bottom donor layer 16 from diffusing into buffer layer 44 during subsequent processing steps. The bottom donor layer 16 supplies charge to the channels (2-DEG) in the GaAs bottom channel support layer 18 deposited thereon. Similarly, the AlGaAs top donor layer 15 supplies charge to channels in the underlying bottom channel support layer 18 as well as the GaAs top channel support layer 17 deposited on layer 15. Lastly, an AlGaAs protective cap layer 50 is deposited on the layer 17 to protect the underlying layers from contamination and damage during handling prior to further processing steps described below. Consequently, layer 50 is sometimes referred to as a sacrificial layer.

The above described layers are preferably formed in nearly continuous fashion using a molecular beam epitaxy (MBE) in a machine such as a Varian Gen II, by Varian Associates of Santa Clara, Calif. However, other processes may be used to form the layers 15–17, 42–45, 50, such as by metal-organic chemical vapor deposition (MOCVD) or by metal-organic or gas source MBE. It is important to control the thickness of the layers 14–17 to close tolerances to assure that the resulting FET 1 (FIG. 1) will have the desired electrical characteristics. Further, the donor layers 15, 16 are doped with an N-type dopant species, such as silicon, during the growth or depositing of the layers 15, 16 to assure dopant uniformity. Alternatively, a P-type dopant species may be used, such as carbon or beryllium. Ranges for the silicon doping density, prior to a subsequent wafer anneal step, ranges from $5 \times 10^{17}$ to $2 \times 10^{18}$ atoms $cm^{-3}$ and is preferably $1.5 \times 10^{18}$ atoms $cm^{-3}$ for both layers 15, 16. However, it is understood that the doping in the layers may be varied according to the desired FET transfer characteristics, described above. The aluminum concentration in the AlGaAs layers within the buffer 43 and layers 15 and 16 are ranges from 10 to 60 percent, with a preferable concentration of approximately 32 percent. The aluminum concentration in the cap layer 50 is as large as practical to achieve the best selectivity during the etch to remove the layer 50 in preference to the GaAs layer 17. For example, the concentration of aluminum in layer 50 should be approximate thicknesses of the layers 15–17, 44, 45, 50 are given below with a resulting FET 1 (FIG. 1) approximately having the electrical characteristics plotted in FIG. 3:

| Layer | Thickness (nanometers) |
|---|---|
| 15 | 22 |
| 16 | 10 |
| 17 | 70 |
| 18 | 35 |
| 44 | 120 |
| 45 | 4 |
| 50 | 20 |

It is noted that the thicknesses for layers 15, 16 include undoped AlGaAs spacer layers (not shown) of about 4 nanometers thick about each side of the portion of each layer having the dopant therein. These spacer layers absorb dopant during subsequent wafer anneal steps to keep the dopant from diffusing into adjacent layers.

The superlattice layer 43 consists of alternating layers of GaAs and AlGaAs, each layer having a thickness less than an electron or hole wave function, e.g., 4 nanometers or less. Here, with aluminum concentrations of about 32 percent, nine alternating layers, or periods, is used to isolate active devices formed in the higher layers 15–17, 44, 45, 50 from the substrate 41 and keep impurities and defects from propagating from the substrate 41 into the higher layers. By using the superlattice layer 43, thinner buffer layers, such as layers 42 and 44, may be used, decreasing the time necessary for the fabrication of the wafer 40.

When the wafer 40 is ready for further processing, layer 50 is stripped off using a etch which preferentially etches the AlGaAs over GaAs, such as an $HF/H_2O_2$ etch disclosed in U.S. Pat. No. 4,943,540, issued to F. Ren and N. Shah and assigned to the same assignee as this invention. This leaves the top channel support layer 17 exposed as shown in FIG. 4. Next a photoresist 51 is deposited and patterned to leave the portions of the major surface of layer 17 exposed where isolation regions are to be formed. The wafer 40 is then implanted with an isolation species 52, such as ionized oxygen, boron, argon, or hydrogen. This step is referred to as a shallow implant, with preferable ranges for ionized oxygen from 20 to 160 KeV, with a dose of $5 \times 10^{12}$ to $1.5 \times 10^{14}$ oxygen ions $cm^{-2}$, the higher the energy, the deeper the implant. An exemplary implant is a dose of $1 \times 10^{14}$ ions $cm^{-2}$ at 40 KeV and then the same dose at 125 KeV. The resulting peak concentration of oxygen atoms in the wafer 40 ranges from $5 \times 10^{18}$ to $1 \times 10^{19}$ atoms $cm^{-3}$.

Figure 5:
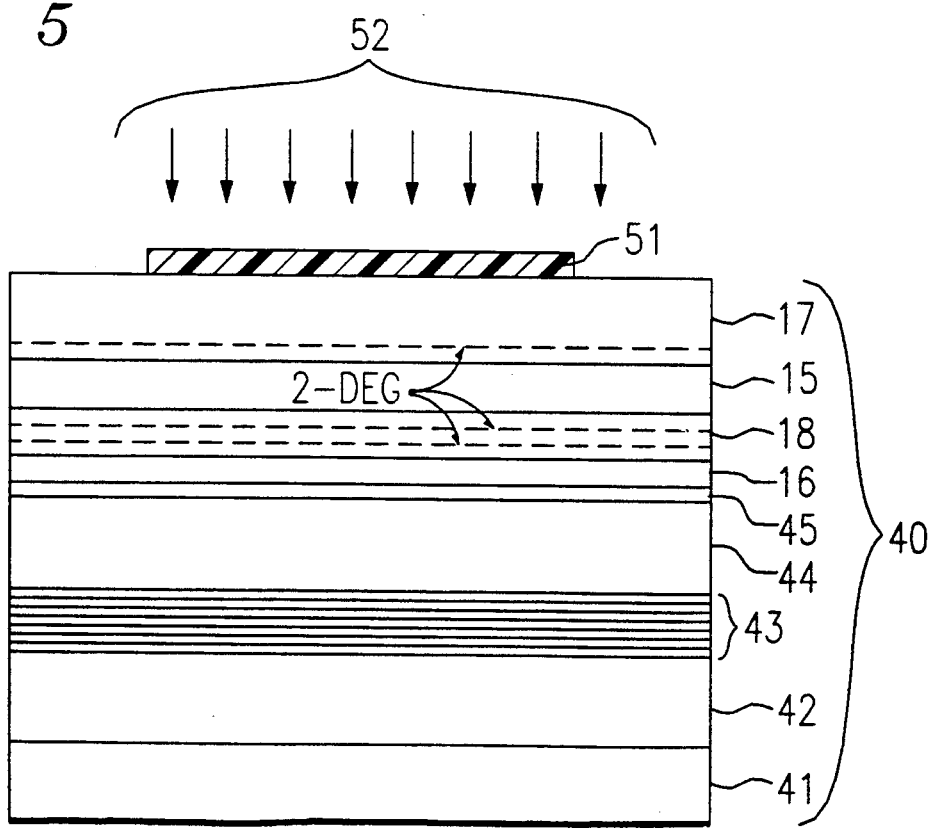
Figure 6:
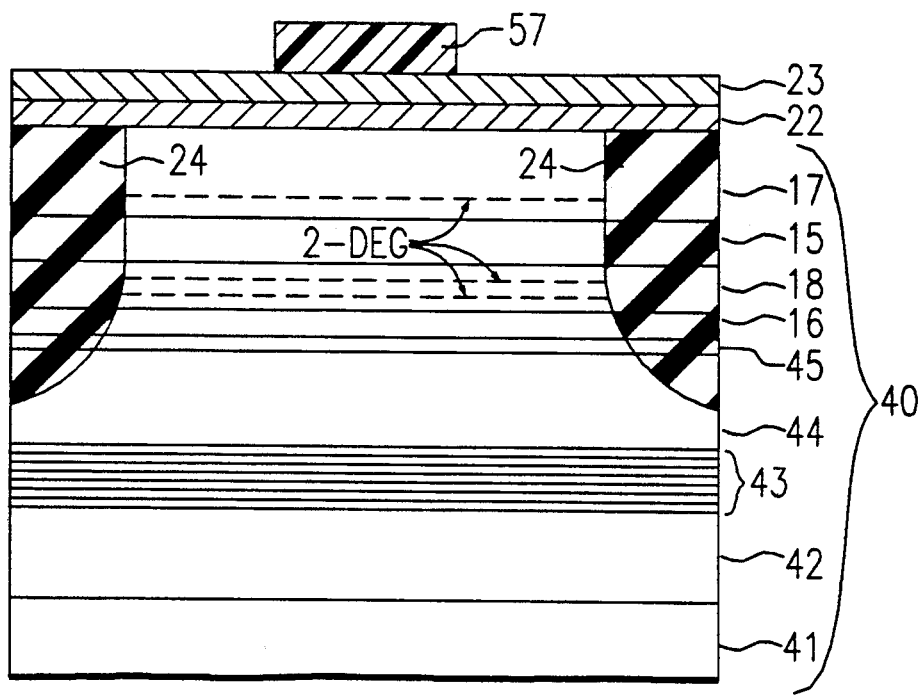
Figure 7:
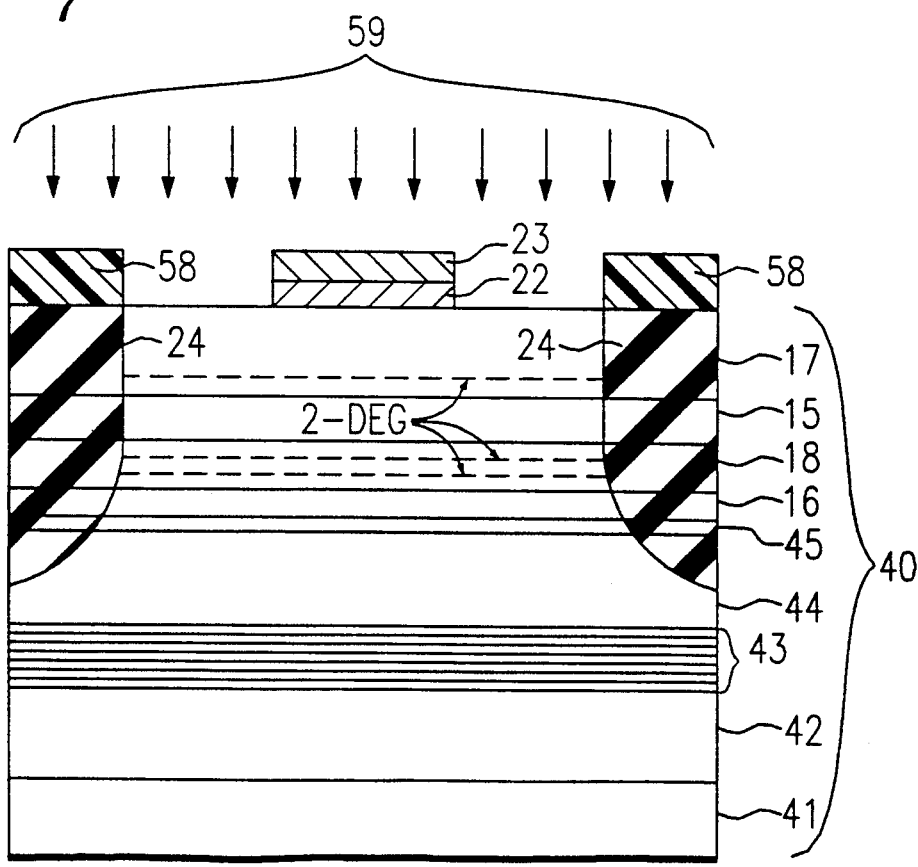

The result of implanting is shown in FIG. 6. Regions of isolation 24, isolating adjacent devices formed in the wafer 40, are shown in this embodiment protruding through layers 45 to 17 and stopping in layer 44. The photoresist 51 (FIG. 5) is removed and a silicide layer 22 is deposited, along with a metal layer 23 thereon, which will form the gate of the transistor. Preferably, the silicide 22 and metal 23 layers are deposited by sputtering in a common chamber of a conventional sputtering machine. In particular, the metal, preferably tungsten, is co-sputtered onto the wafer 40, along with silicon, until the desired thickness of silicide is formed. Then the silicon source is removed and just metal is deposited until the desired thickness of metal is formed. Alternatively, tungsten nitride or tungsten silicide nitride may be used as layer 22. Next, a layer of photoresist 57 is deposited and patterned to leave photoresist 57 where the gates of the later-formed FETs are to be made out of the underlying metal 23 and silicide 22 layers. The exposed portions of the layers 22, 23 are then etched preferably in a reactive ion etch using nitrogen trifluoride, sulfur hexafluoride or carbon tetrafluoride. The etch exposes the major surface of layer 17, as shown in FIG. 7. The remaining portions of layers 22, 23 collectively form the gate of the later-formed FET. It is noted that layer 22 or layer 23 may be used alone to form a gate, but the combination of both layers may result in superior FET performance than either layer alone. It is further noted that although the layers 22, 23 are shown to have substantially equal widths, in reality, the etch rate for the layers is different, the etching of layer 23 being slower than that of layer 22. In the preferred embodiment, the width of layer 22 after etching is about 0.45 microns while the width of the metal layer 23 is about 0.6 microns, forming what is commonly known as a "T" gate structure. Additionally gold, or a similar high conductivity metal may be deposited on top of metal layer 23 (or 22 if layer 23 is omitted) in order to further reduce gate metal resistance.

Figure 8:
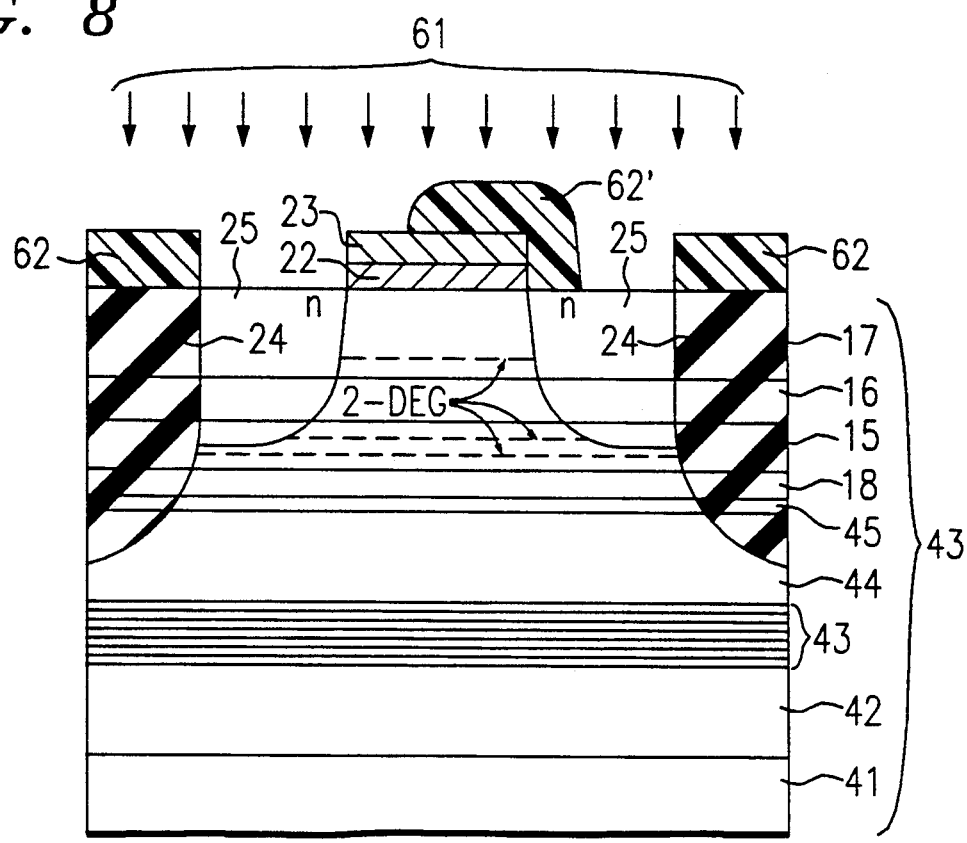

Next, a layer of photoresist 58 is deposited and patterned to substantially cover the isolation regions 24 and other portions of the surface of layer 17 where no dopant species are to be implanted. The wafer 40 is then implanted with dopant species 59 where exposed. This forms doped regions 25 near the surface of the wafer 40 as shown in FIG. 8. Note that the layers 22, 23 mask the implant 59 for a self-aligned structure, as will be explained in more detail below. It is further noted that the implant 59 is an optional step if lightly-doped-drain structures (LDD) are not needed. The implant dopant species is typically the same as that used to dope layers 15, 16, here silicon. The implant has an exemplary energy range of 20 to 150 KeV and a dose of $1 \times 10^{12}$ to $3 \times 10^{13}$ silicon ions $cm^{-2}$. An exemplary implant is a dose of $2 \times 10^{12}$ ions $cm^{-2}$ at 35 and 90 KeV. The resulting peak concentration of silicon ions in the wafer 40 before an annealing step ranges from $1 \times 10^{17}$ to $5 \times 10^{17}$ atoms $cm^{-3}$.

Figure 9:
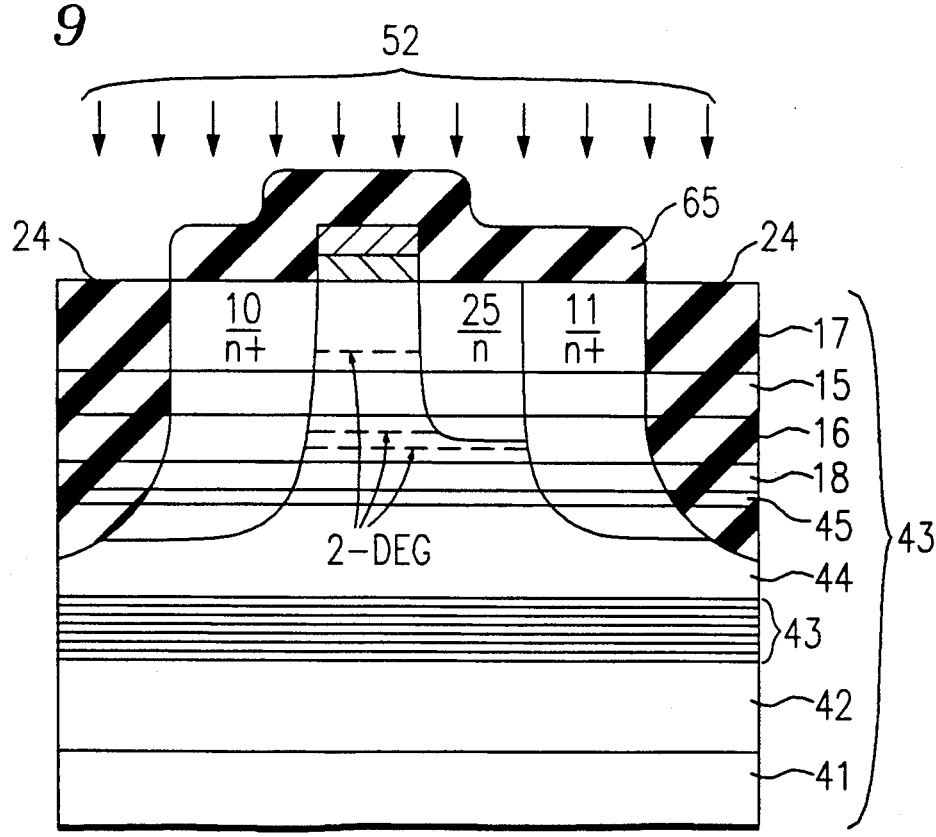

To form the actual source and drain regions 10, 11 (FIG. 1), the photoresist 58 (FIG. 7) is removed and a new layer of photoresist 62 is deposited and patterned on the wafer 40. The photoresist 62 covers substantially the same places on the wafer 40 as did photoresist 58, except that additional area is covered, 62', where the lightly-doped drain regions are to be formed. Note that if the LDD is not to be used, the photoresist 62' is not used. Similarly, if the LDD structure is to be used as part of the source region as well as the drain, the resist 62' may be enlarged as to cover both sides of the gate layers 22, 23. An implant of dopant species 61, the same as used during the implant 59 (FIG. 7), forms the source and drain n+regions 10, 11 as shown in FIG. 9. Note that for the source region 10, the implant substantially overlaps the earlier implant formed regions 25 (FIG. 8). The resulting structure has a lower doping density region 25 (LDD) adjacent to and in contact with the drain region 11. The implant 61 (FIG. 8) has an energy range of 20 to 150 KeV and a dose of $3 \times 10^{12}$ to $3 \times 10^{13}$ silicon ions cm$^{-2}$. The resulting peak concentration of silicon ions in the wafer 40 before an annealing step ranges from $1 \times 10^{18}$ to $3 \times 10^{18}$ ions cm$^{-3}$. Practically, the concentration of $2 \times 10^{18}$ silicon ions cm$^{-3}$ is the upper limit.

The effect of the regions 10, 11, and 25 is to change the conductivity of the layers in those regions to n-type, which destroys the channels (2-DEG) therein except under the gate of layers 22, 23. At the same time, the regions 10, 11, and 25 contact the channels (2-DEG) to conduct current therefrom. Therefore, the regions 10 and 11 contact all the channels (2-DEG). It is noted, however, that for this embodiment the region 25 does not contact all the channels (2-DEG); the bottom-most channel in layer 18 terminates only on regions 10 and 11.

After the implanting for the n+regions 10, 11 is completed, the wafer 40 is subject to a high temperature anneal to activate the silicon dopants in layers 15, 16 and regions 10, 11, and 25. An exemplary annealing step is the heating of the wafer 40 to a temperature of approximately 800° C. for approximately 10 minutes in an atmosphere of arsenic at a pressure of 100 milliTorr or greater, preferably with a capping layer (not shown) of disilicon dioxide, silicon oxynitride, or silicon nitride. Alternatively, a rapid thermal anneal could be used at an exemplary temperature of 825° C. for 30 seconds. As stated above, the silicon dopant in donor layers 15, 16 out-diffuses and converts portions of those layers previously undoped.

Figure 10:
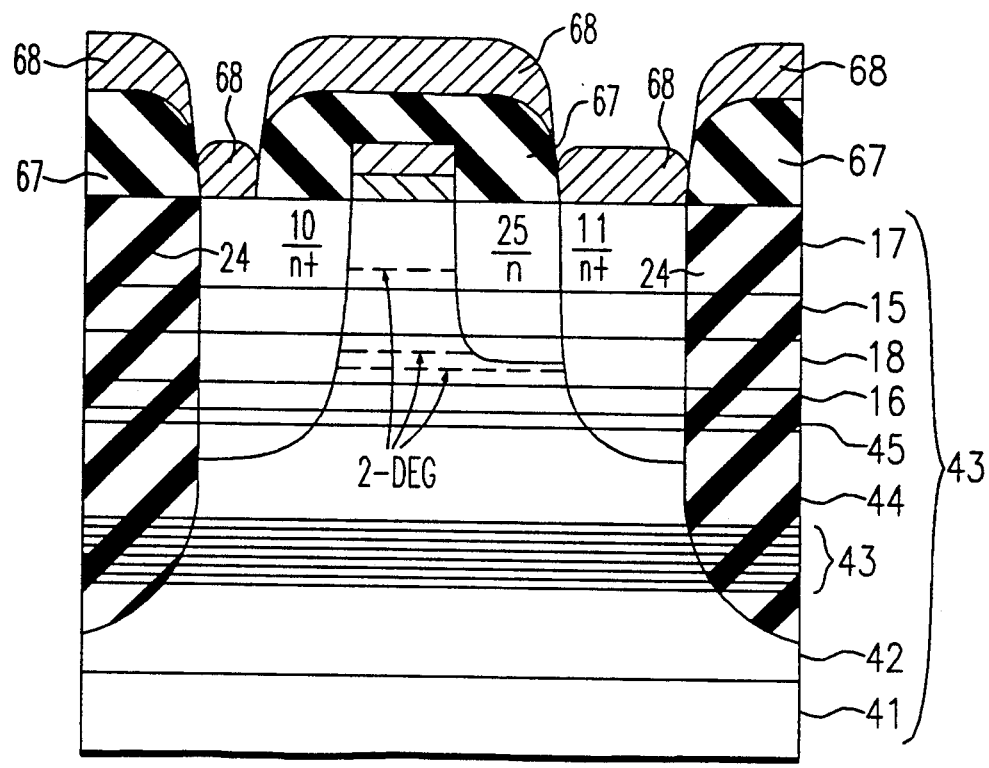

After the high-temperature anneal step described above, a deeper isolation implant is done as shown in FIG. 9. Here the same mask as used to pattern the photoresist 51 in the shallow implant of FIG. 5 is used to pattern a photoresist layer 65. Again, the isolation implant species 52 is implanted into exposed portions of the wafer 40 (here into isolation regions 24). An exemplary implant is $2 \times 10^{13}$ doubly ionized oxygen ions cm$^{-2}$ at 130 Kev, resulting in a peak concentration of $5 \times 10^{17}$ to $5 \times 10^{18}$ atoms cm$^{-3}$. As discussed above, it is understood that other implant species could be used, such as boron, argon, or hydrogen. Preferably, the implant species should be the same for both the shallow and deep isolation implants. After the deep isolation implant, the isolation regions 24 now extend through the superlattice layer 43 as shown in FIG. 10. This isolation step substantially removes any low conductivity paths between adjacent devices separated by the regions 24 as well as destroying the channels (2-DEG) therebetween. After removal of the photoresist 65 (FIG. 9), the wafer 40 is annealed in an atmosphere of helium or nitrogen at an exemplary 500° C. for 10 minutes or a by rapid thermal anneal at an exemplary temperature of 550° C. for 30 seconds.

Contacting the drain and source regions requires ohmic contacts to the major surface portions of the layer 17 that overlay the regions 10, 11. In this embodiment, a photoresist 67 is deposited and patterned to leave the major surface of layer 17 exposed where the contacts are to be formed. An exemplary first layer of gold and germanium alloy is deposited, mixed together or in thin alternating layers, then a layer of nickel and another layer of gold is deposited, collectively labeled here as 68. The gold:germanium alloy assures an ohmic contact to the doped GaAs layer 17. Other metals may be used as an ohmic contact, such as gold:germanium/silver/gold or nickel/gold:germanium/gold. The unwanted metal 68 is "lifted off" during the removal of the photoresist 67, leaving source and drain contacts 20, 21 as shown in FIG. 1. It is noted that if aluminum conductors are to be in electrical contact the contacts 20, 21, a barrier between the gold of the ohmic contacts 20, 21 and the aluminum conductors may be deposited (not shown) as the top-most layer on the ohmic contact metal 20, 21. Exemplary barrier materials are tungsten silicide, tungsten nitride, or tungsten silicide nitride.

After removal of the photoresist 67 and the unwanted metal 68, the wafer 40 (FIG. 10) is again annealed to alloy the remaining metal to form the ohmic metal contacts for the source and drain contacts 20, 21. The exemplary anneal is a low temperature anneal of 350°–450° C. for 10 to 60 seconds in an atmosphere of helium or nitrogen.

It is noted that the deep isolation implant, discussed above, can occur after the deposition of the ohmic contacts metal 68 (FIG. 10), thereby combining the annealing steps for both the ohmic contact and the deep isolation implant.

Further processing of the FET 1, such as adding layers of metalization to interconnect the source, drain and gate connections thereof, may utilize conventional IC processing technology, such as silicon dioxide dielectric and aluminum metalization. Other techniques are discussed in the Ahrens et al. application cited above.

Using the above-given layer thicknesses, doping levels and gate sizes, in FET 1 (FIG. 1) was fabricated having an exemplary transconductance of 120 mS/mm. The FET 1 has a power gain of 16 dB at 10 GHz with a power supply voltage of 10 volts operating in class A.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. A method of making a field-effect transistor, CHARACTERIZED BY THE STEPS OF:
    forming on a substrate a plurality of alternating donor and conduction layers arranged from top to bottom, each layer having a thickness, the donor layer having a wider bandgap than the conduction layer and having donor impurities therein for providing carriers to channels in the conduction layers, the thicknesses of the conduction layers decreasing from the top to bottom layers;
    forming a gate on the top conduction layer;
    implanting into the donor and conduction layers, masked by the gate, to form self-aligned source and drain regions; and,
    contacting the so formed source and drain regions;
    wherein each of the channels are at different depths below the gate; and
    wherein the thickness of the conduction layers, the depths of the channels, and the charge carrier concentrations therein are selected to provide a substantially linear transistor gate input voltage-to-output drain current transfer characteristic over substantially all gate input voltages between pinch-off and channel saturation.

2. The method of making a field-effect transistor as recited in claim 1, wherein the gate is a metal deposited on one of the plurality of channel layers to form a rectifying contact therewith.

3. The method of making a field-effect transistor as recited in claim 2, further characterized by the steps of:
forming a superlattice of alternating wide and narrow bandgap material between the substrate and the plurality of donor and conduction layers; and,
forming a buffer layer of a wide bandgap material between the superlattice and plurality of donor and conduction layers.

4. The method of making a field-effect transistor as recited in claim 3, further characterized by the step of implanting isolation species to isolate adjoining transistors.

5. The method of making a field-effect transistor as recited in claim 4, further characterized by the step of depositing a cap layer of wide bandgap material to protect the exposed conduction layer, the cap layer being substantially removed prior to the formation of the gate.

6. The method of making a field-effect transistor as recited in claim 2 further characterized by:
forming a first lightly doped region of predetermined width into the channel layer having the gate thereon, between the gate and one of the source and drain regions, the resistivity of the region being greater than that of the source and drain regions;
wherein the threshold voltage of the transistor is dependent on the width of the lightly doped region.

7. The method of making a field-effect transistor as recited in claim 6, wherein the lightly doped region is juxtapositioned to, and in contact with, the one source or drain region.

8. The method of making a field-effect transistor as recited in claim 7, further characterized by:
forming a second lightly doped region of predetermined width into the channel layer having the gate thereon, between the gate and the other one of the two source and drain regions, the resistivity of the second lightly doped region being substantially the same as the first lightly doped region.

9. The method of making a field-effect transistor as recited in claim 8, wherein the widths of the first and second lightly doped regions are substantially the same and formed at substantially the same time.

* * * * *